US006748579B2

(12) United States Patent
Dillon et al.

(10) Patent No.: US 6,748,579 B2
(45) Date of Patent: Jun. 8, 2004

(54) METHOD OF USING FILLER METAL FOR IMPLEMENTING CHANGES IN AN INTEGRATED CIRCUIT DESIGN

(75) Inventors: Michael N. Dillon, Richfield, MN (US); Khosro Khakzadi, Woodbury, MN (US); Scott A. Peterson, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/231,904

(22) Filed: Aug. 30, 2002

(65) Prior Publication Data

US 2004/0044983 A1 Mar. 4, 2004

(51) Int. Cl.[7] .............................................. G06F 17/50
(52) U.S. Cl. .............................. 716/19; 716/20; 716/21
(58) Field of Search .............. 716/19–21; 438/598–601, 438/183, 626; 257/202, 296, 401

(56) References Cited

U.S. PATENT DOCUMENTS

| | | | | | |
|---|---|---|---|---|---|
| 5,459,093 | A | * | 10/1995 | Kuroda et al. | 438/599 |
| 5,956,618 | A | * | 9/1999 | Liu et al. | 438/183 |
| 5,959,320 | A | * | 9/1999 | Torgerson et al. | 257/296 |
| 5,988,146 | A | * | 11/1999 | Jan et al. | 257/401 |
| 6,093,214 | A | | 7/2000 | Dillon | 716/17 |
| 6,194,912 | B1 | * | 2/2001 | Or-Bach | 326/38 |
| 6,327,695 | B1 | * | 12/2001 | Bothra et al. | 716/8 |
| 6,355,976 | B1 | * | 3/2002 | Faris | 257/686 |
| 6,417,529 | B1 | * | 7/2002 | Tanaka | 257/202 |
| 6,593,226 | B2 | * | 7/2003 | Travis et al. | 438/626 |
| 2002/0024148 | A1 | * | 2/2002 | Itoh | 257/784 |
| 2002/0120911 | A1 | * | 8/2002 | Hino et al. | 716/11 |
| 2003/0155927 | A1 | * | 8/2003 | Printo et al. | 324/501 |

OTHER PUBLICATIONS

B.E. Stine et al., "The Physical and Electrical Effects of Metal–Fill Patterning Practices for Oxide Chemical–Mechanical Polishin Processes", 1998 IEEE Transactions On Electron Devices, vol. 45, No. 3, pp. 665–679.*

A.B. Kahng et al., "Filling Algorithms and Analyses for Layout Density Control", Apr. 1999 IEEE Transactions on Computer–Aided Design of Integrated Circuits and Systems, vol. 18,No. 4, pp. 445–462.*

L. E. Camilletti, "Implementation of CMP–based design rules and patterning practices", Advanced Semiconductor Manufacturin Conference and Workshop, 1995. ASMC 95 Proceedings. IEEE/SEMI 1995, Nov. 13–15, 1995 Page(s): 2 –4.*

* cited by examiner

*Primary Examiner*—Vuthe Siek
*Assistant Examiner*—Naum Levin
(74) *Attorney, Agent, or Firm*—Westman, Champlin & Kelly

(57) ABSTRACT

A method is provided for fabricating an integrated circuit having a logical function. The method includes fabricating first and second routing layer masks and a first via mask. The first routing layer mask includes power supply segments and signal segments. The second routing layer mask includes signal segments and filler segments, wherein the filler segments are located in unused areas of the second routing layer mask. The first via mask defines vias that electrically couple the filler segments to the power supply segments. If the logical function is changed after the masks have been fabricated, a second via mask is fabricated. The second via mask decouples a filler segment from the power supply segments and couples the filler segment to a signal segment defined by the first routing layer mask to implement the logical function change. The integrated circuit is then fabricated with the first and second routing layer masks and the second via mask.

13 Claims, 6 Drawing Sheets

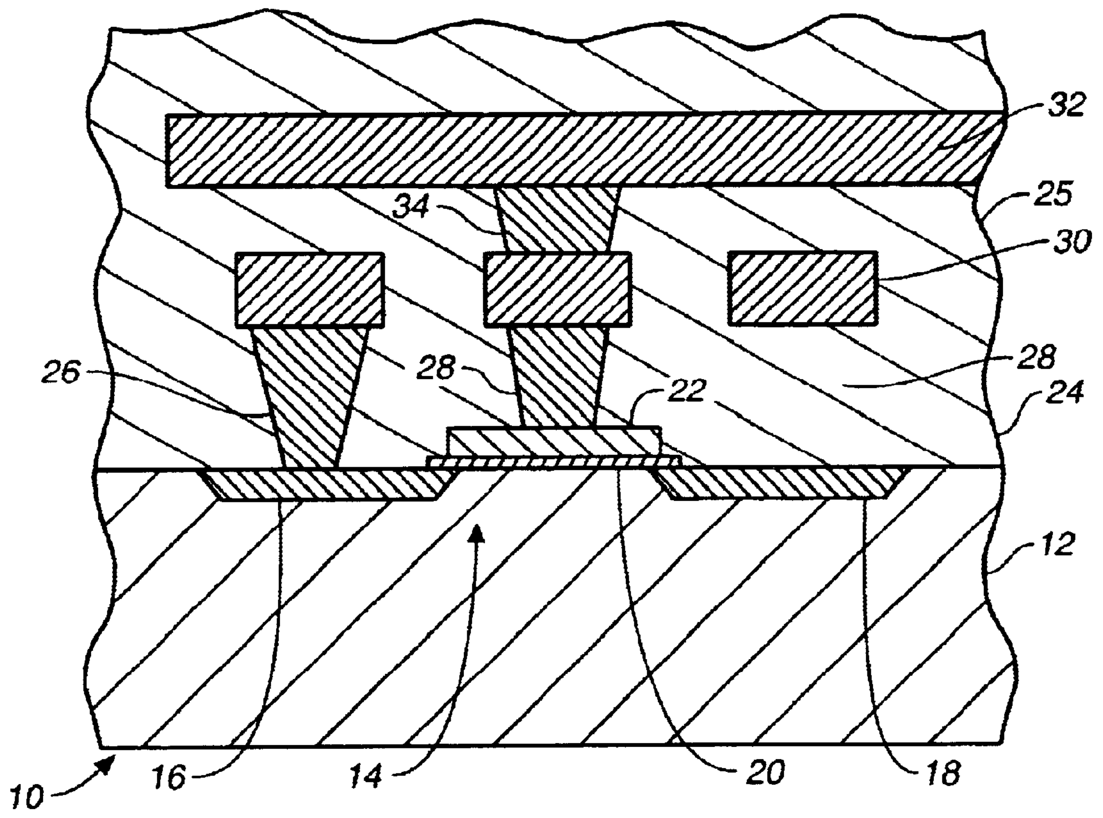
FIG._1

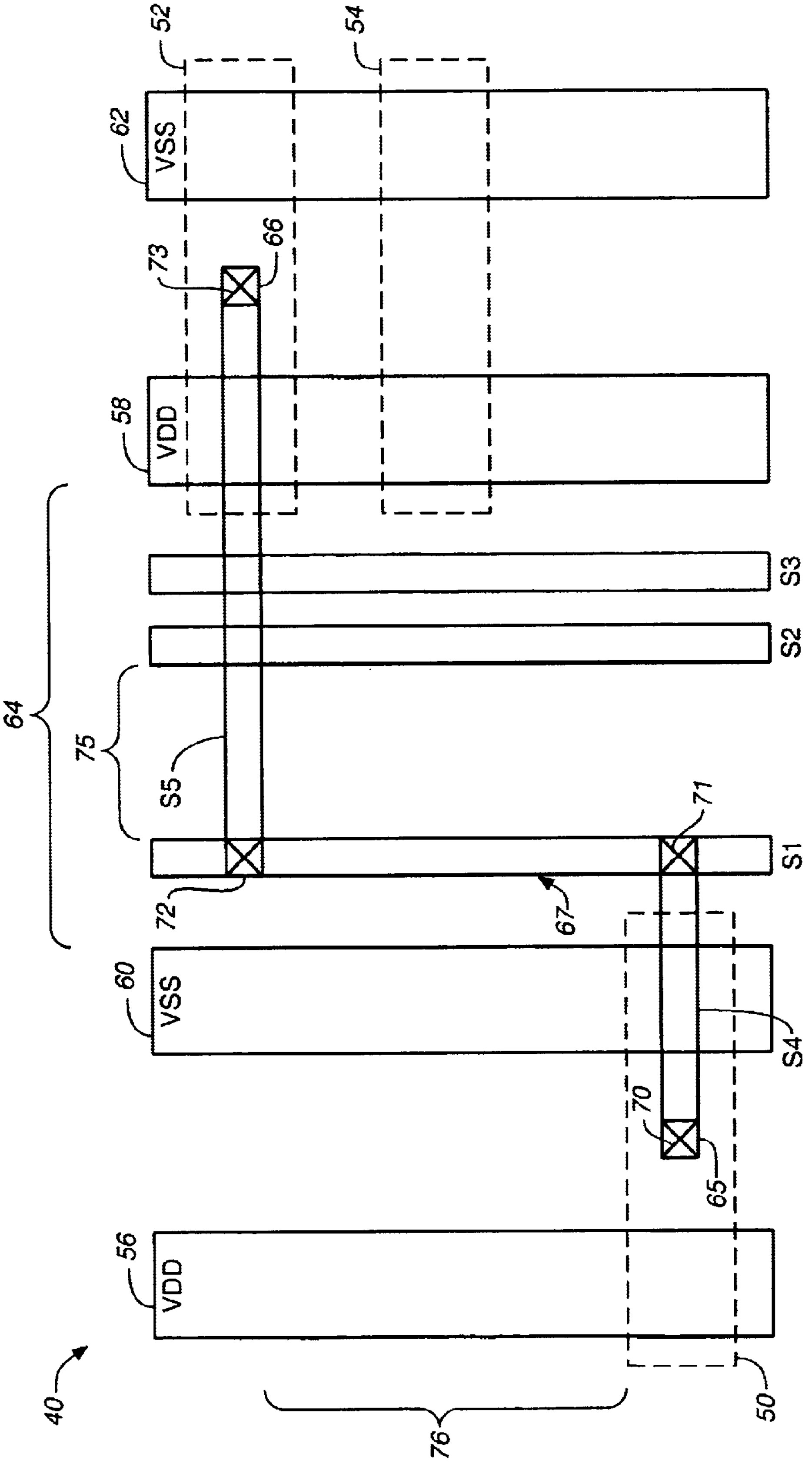
FIG._2

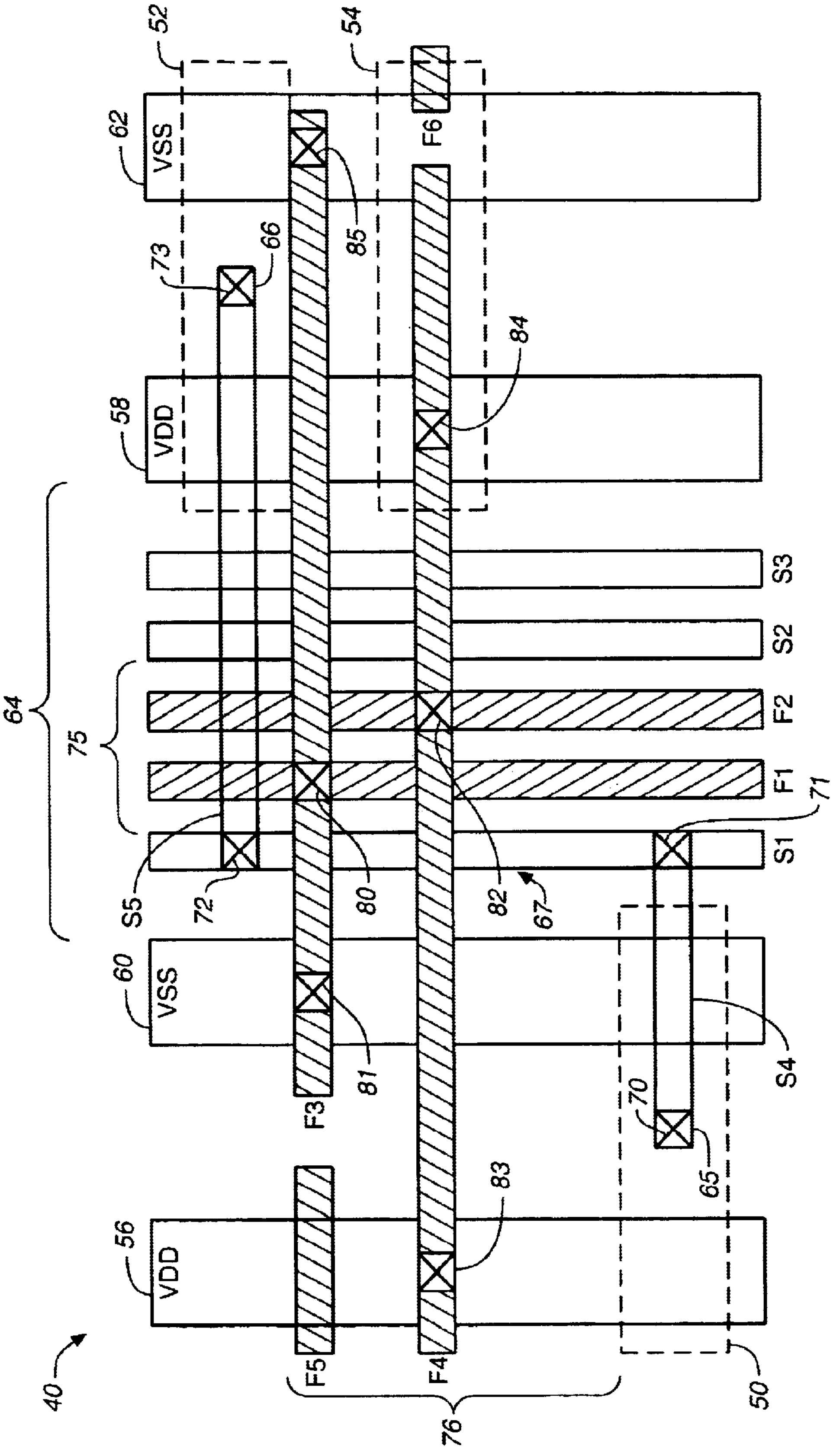
FIG._3

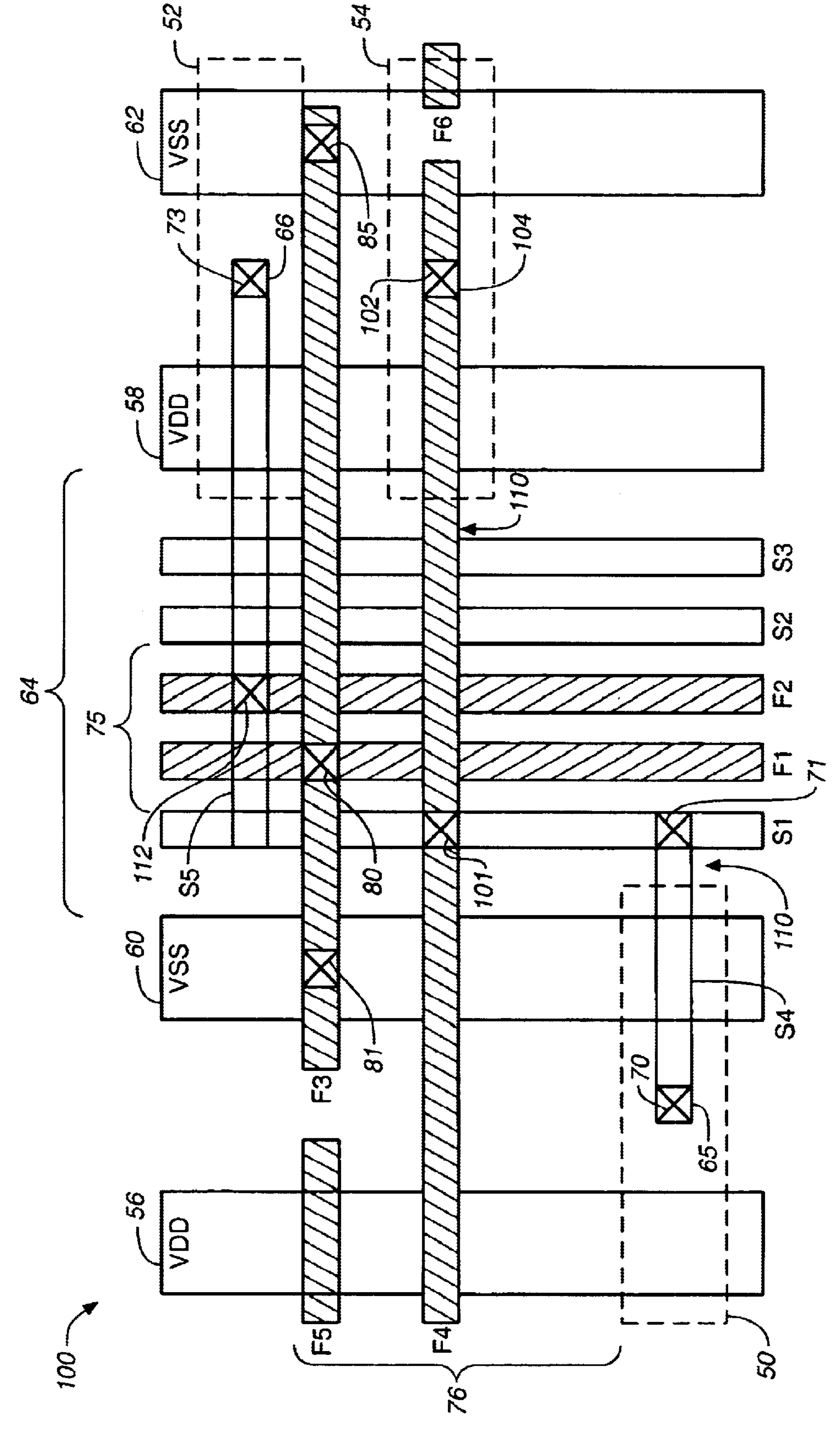
FIG._4

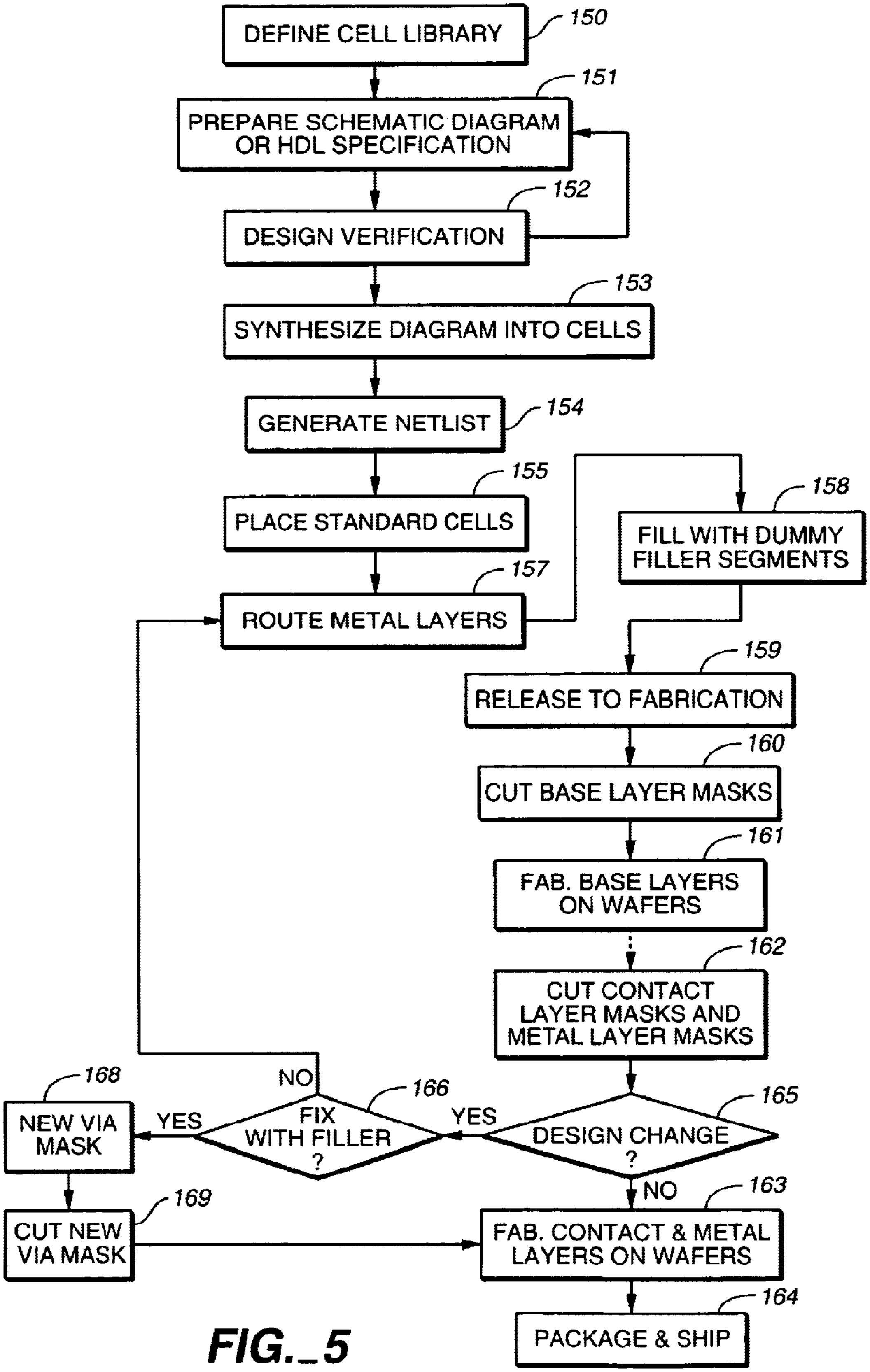
FIG._5

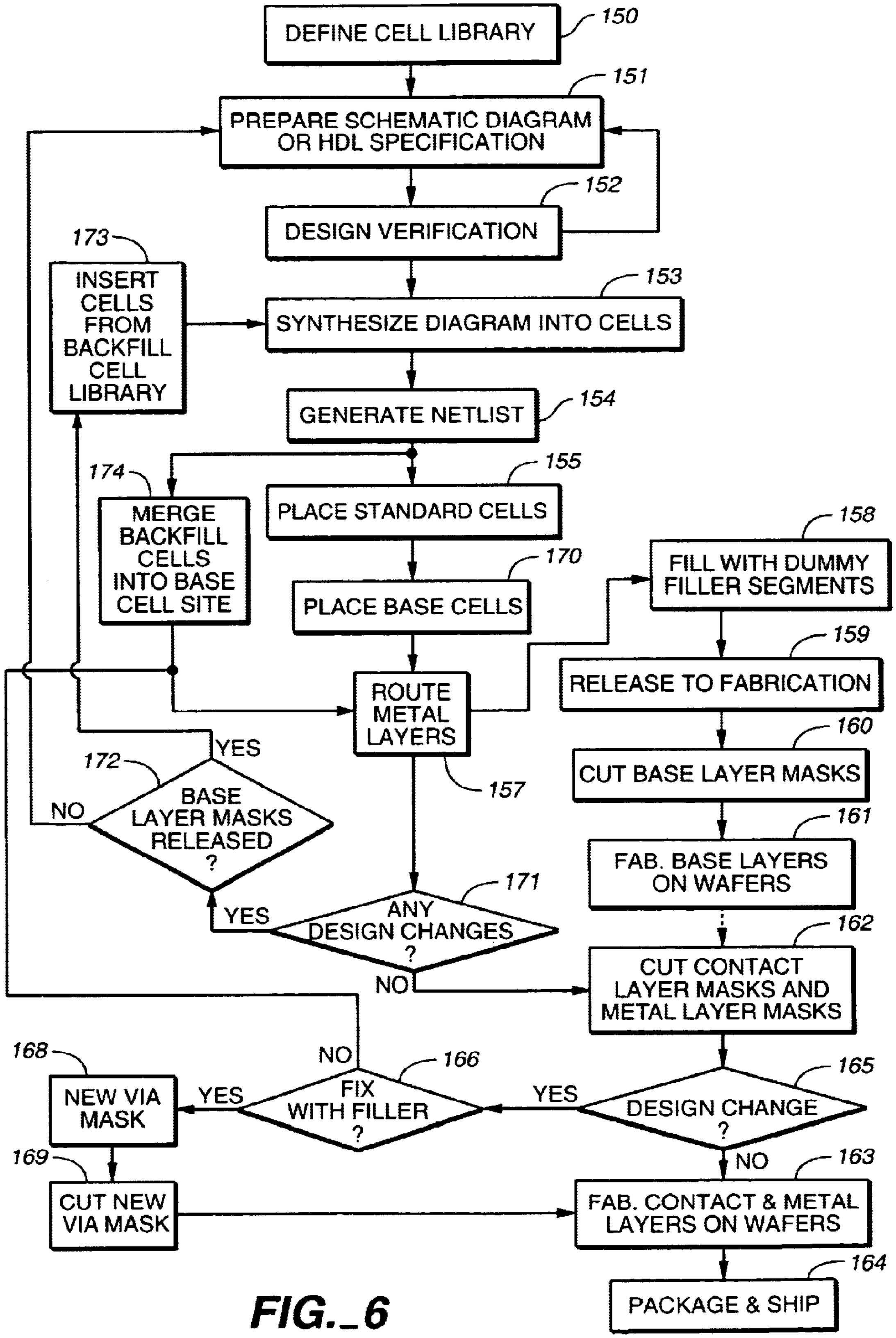
FIG._6

METHOD OF USING FILLER METAL FOR IMPLEMENTING CHANGES IN AN INTEGRATED CIRCUIT DESIGN

FIELD OF THE INVENTION

The present application relates to the fabrication of semiconductor integrated circuits and, more particularly, to a method of using a filler or "dummy" metal for aiding in subsequent design changes.

BACKGROUND OF THE INVENTION

Semiconductor integrated circuits are designed and fabricated by first preparing a schematic diagram or hardware description language (HDL) specification of a logical circuit in which functional elements are interconnected to form a particular logical function. With standard cell technology, for example, a schematic diagram or HDL specification is synthesized into standard cells of a specific cell library. A series of computer-aided design tools generate a netlist of the selected cells and the interconnections between the cells. The netlist is used by a floor planner or placement tool to place the selected cells at particular locations in an integrated circuit layout pattern. The interconnections between the cells are then routed along predetermined routing layers. Once the selected cells have been placed and routed, the netlist, the cell layout definitions, the placement data and the routing data together form an integrated circuit layout definition which is used to fabricate the integrated circuit.

The integrated circuit is fabricated by depositing multiple layers on a substrate known as a wafer. The lowest, "base" layers include the active areas of the transistors, including the diffusion regions and the gate oxide areas, and the desired patterns of the polysilicon gate electrodes. These layers are fabricated through a sequence of pattern definition steps, which are interspersed with other processed steps such as oxidation, etching, doping and material deposition. The additive or subtractive process steps are preceded by masking steps, which define the desired geometric patterns on the wafer. One or more layers are then deposited on top of the base layers and patterned to form conductive segments, which interconnect the various semiconductor devices formed in the base layers. Electrical contacts or vias are formed to electrically connect a conductive segment on one of the metal layers with a conductive segment or semiconductor device on one of the other layers on the wafer.

There is often a desire to release semiconductor designs to fabrication as early as possible in the design cycle. Subsequent design verification often results in the identification of design errors. Correction of the design errors may involve the addition of one or more standard cells into the netlist and/or changes or additions to the placement and routing data. Unfortunately, correction of these design errors can be extremely costly if made during the fabrication process. Correction may involve re-cutting the base layer mask set, re-cutting the metal layer mask set and, if wafer fabrication has begun, scrapping entire wafer lots.

Methods are therefore desired that allow for changes in the interconnections or "nets" between the cells without necessarily requiring the fabrication of a full metal layer mask set.

SUMMARY OF THE INVENTION

One embodiment of the present invention is directed to a method of fabricating photolithography masks for an integrated circuit. The method includes fabricating a set of routing layer masks, which define conductive segments including signal segments, power supply segments and filler segments on various routing layers of the integrated circuit. The filler segments are located in areas unused by the signal segments and the power supply segments. A first via mask is fabricated, which defines electrical connections between the conductive segments on at least two of the routing layers, including connections between the filler segments on one of the layers and the power supply segments on another of the layers. If a signal net on the integrated circuit needs changing after fabricating at least one of the routing layer masks and the first via mask, a second via mask is fabricated to replace the first via mask. The second via mask decouples a first of the filler segments from a first of the power supply segments and couples the first filler segment into the signal net.

Another embodiment of the present invention is directed to a method for fabricating an integrated circuit having a logical function. The method includes fabricating first and second routing layer masks and a first via mask. The first routing layer mask includes power supply segments and signal segments. The second routing layer mask includes signal segments and filler segments, wherein the filler segments are located in unused areas of the second routing layer mask. The first via mask defines vias that electrically couple the filler segments to the power supply segments. If the logical function is changed after the masks have been fabricated, a second via mask is fabricated. The second via mask decouples a filler segment from the power supply segments and couples the filler segment to a signal segment defined by the first routing layer mask to implement the logical function change. The integrated circuit is then fabricated with the first and second routing layer masks and the second via mask.

Yet another embodiment of the present invention is directed to a collection of masks for fabricating a portion of an integrated circuit. The collection of masks includes first and second routing layer masks and first and second via masks. The first routing layer mask defines conductive segments, including a plurality of signal segments and at least one power supply segment. The second routing layer mask defines conductive segments, including a plurality of signal segments and at least one filler segment located in an area unused by the signal segments. The first via mask defines locations of conductive vias between the conductive segments defined by the first and second routing layer masks, including a first via that couples the filler segment to the power supply segment. The second via mask is a replacement for the first via mask. The second via mask eliminates the first via and adds a second via that couples the filler segment to one of the signal segments defined by the first routing layer mask instead of the power supply segment.

BRIEF DESCRIPTION OF THE DRAWINGS

FIG. 1 is a schematic representation of a fragmentary, cross-sectional view of a semiconductor integrated circuit that can be fabricated according to the present invention.

FIG. 2 is a top plan view, which schematically illustrates the routing pattern of a portion of an integrated circuit prior to such a logical function the change.

FIG. 3 is a top plan view, which schematically illustrates the routing pattern in FIG. 2 after unused routing areas have been filled with unused dummy metal, according to one embodiment of the present invention.

FIG. 4 is a top plan view, which schematically illustrates the routing pattern following a change to a via mask that is used to create vias between first and second metal routing layers.

FIG. 5 is a flowchart illustrating an integrated circuit fabrication process according to one embodiment of the present invention.

FIG. 6 is a flowchart illustrating an integrated circuit fabrication process according to an alternative embodiment of the present invention.

DETAILED DESCRIPTION OF THE PREFERRED EMBODIMENTS

FIG. 1 is a schematic representation of a fragmentary, cross-sectional view of a semiconductor integrated circuit that can be fabricated according to the present invention. Semiconductor integrated circuit 10 includes a wafer or substrate 12. A metal-oxide semiconductor field-effect transistor (MOSFET) 14 is fabricated on wafer 12. A first photolithography mask is used to form the active areas of transistor 14, such as source and drain diffusion regions 16 and 18 and gate oxide layer 20. A second photolithography mask is used to define the desired pattern for polysilicon gate 22. Other combinations of masks can be used to fabricate the transistor features in alternative embodiments or with alternative technologies. The masks used to pattern the transistor features and the polysilicon gate electrode are referred to as "base" layer masks.

After the base layers have been fabricated on wafer 12, a dielectric layer 24 is applied over the base layers. A third photolithography mask is used to form electrical contacts 26 and 28, which are electrically coupled to diffusion region 16 and polysilicon gate 22, for example. Additional photolithography masks are used to pattern metal routing layers 30 and 32 and conductive vias, such as via 34, which electrically connect conductive segments on one metal routing layer with conductive segments or contacts on other routing layers. Each metal routing layer is electrically isolated from the other metal routing layers by a dielectric layer, such as dielectric layers 24 and 25. Typically, the conductive segments in one metal routing layer are oriented orthogonally to the conductive segments in the next adjacent metal routing layer. For example, the conductive segments in metal routing layer 30 are oriented into the page in FIG. 1, and the conductive segments in metal routing layer 32 are oriented along the page in FIG. 1.

The contacts of each semiconductor device on the integrated circuit are connected to the contacts of other semiconductor devices on the integrated circuit through one or more "nets". These nets are formed by conductive segments on one or more of the metal layers 30 and 32, which are connected through one or more vias, such as via 34. The location of each conductive segment and via that will be formed on the integrated circuit is defined by the patterns of the photolithography masks used to form the routing layers and the vias.

As semiconductor technologies advance and become more complex, the costs associated with manufacturing each of these masks has increased significantly. Once these masks have been fabricated, any change to a net often requires a change to one or more of the masks used to fabricate the integrated circuit. According to one embodiment of the present invention, changes to one or more nets can be made by changing one or more of the via masks while reducing or eliminating any need to make changes to the metal routing layer masks.

In a typical standard cell chip layout, after all the signal, power and clock segments have been routed, many open routing channels remain that are left unused. These unused channels can be large enough such that additional metal should be added to satisfy minimum metal coverage requirements for manufacturing. This unused or "dummy" metal sufficiently fills the unused areas such that subsequent layers on the integrated circuit are substantially planar. The unused dummy metal can be electrically coupled to the previously routed power and ground segments through one or more vias to increase integrity of the power mesh.

According to one embodiment of the present invention, if a change is made to the logic function after the routing layer masks have been fabricated one or more of the unused conductive segments can be de-coupled from the power supply mesh. These unused conductive segments can then be re-coupled to form part or all of a signal net for the new logical function. This de-coupling and re-coupling can often be accomplished by changing one or more of the via masks without necessarily changing any of the routing layer masks.

FIG. 2 is a top plan view, which schematically illustrates a routing pattern 40 of a portion of an integrated circuit prior to such a logical function the change. First and second metal routing layers are superimposed on one another in FIG.2. The conductive segments in the first metal routing layer (such as layer 30 in FIG. 1) extend vertically in FIG. 2, and the conductive segments in the second metal routing layer (such as layer 32 in FIG.1) extent horizontally in FIG. 2.

The integrated circuit includes a plurality of semiconductor devices shown schematically by dashed lines 50, 52 and 54. Power straps 56 and 58 (labeled "VDD") and ground straps 60 and 62 (labeled "VSS") are routed along the first metal routing layer for providing power to semiconductor devices 50, 52 and 54. In addition, the first metal routing layer includes conductive signal segments S1, S2 and S3, which are routed along a routing channel 64 between device 50 and devices 52 and 54. The second metal routing layer includes conductive signal segments S4 and S5. For simplicity, only five conductive signal segments are shown in FIG. 2. The portion of routing pattern 40 that is shown in FIG. 2 could have many additional signal segments in each routing layer in an actual embodiment.

Semiconductor 50 has a contact 65 which is coupled to a contact 66 of device 52 through a signal net 67. Net 67 is defined by conductive signal segment S1 on the first metal routing layer, conductive signal segments S4 and S5 on the second metal routing layer, and conductive vias 70–73. Via 70 connects signal segment S4 to contact 65, while via 71 connects signal segment S4 to signal segment S1. Via 72 connects signal segment S1 to signal segment S5, and via 73 connects signal segment S5 to contact 66. Signal segments S2 and S3 are connected in nets between other semiconductor devices on the integrated circuit that are not shown in FIG. 2.

Area 75 represents an area within channel 64 of the first routing layer that is unused by power and ground segments, signal segments and clock segments. Area 76 represents an area within the second routing layer that is unused by power and ground segments, signal segments and clock segments. In a typical integrated circuit, these areas 75 and 76 are often filled with unused "dummy" metal to improve planarization of the integrated circuit.

FIG. 3 is a top plan view, which schematically illustrates the routing pattern 40 after areas 75 and 76 have been filled with unused dummy metal, according to one embodiment of the present invention. Unused area 75 is tilled with dummy or "filler" conductive segments E1 and F2, which are routed along the first metal routing layer. Filler segments F3–F6 are routed along unused area 76 within the second metal routing layer. For simplicity, only five filler segments are shown in FIG. 3. It should be understood that additional segmented or non-segmented filler metal (not shown) can be routed in any of the routing layers to completely fill any unused areas.

Filler segments F1–F6 can be used to improve the power and ground mesh structures of the integrated circuit or as signal nets to implement subsequent design changes. Segmenting filler segments F1–F6 into shorter wire lengths increases the ability of the segments to be re-used as signal segments, if necessary. In the example shown in FIG. 3, filler segments F1 and F3 are initially coupled to the ground supply mesh formed by ground supply straps 60 and 62. Filler segment F1 is electrically coupled to filler segment F3 through via 80, and filler segment F3 is electrically connected to ground supply straps 60 and 62 through vias 81 and 85. Similarly, filler segments F2 and F4 are initially coupled to the power supply mesh formed by the power supply straps 56 and 58. Filler segment F2 is electrically coupled to filler segment F4 through via 82, and filler segment F4 is electrically coupled to power supply straps 56 and 58 through vias 83 and 84, respectively. These filler segments can therefore also be referred to as "power supply segments" since they are coupled to the power supply mesh.

Assume for example that after the photolithography masks for the first and second routing layers and the via layers have been fabricated a design error is detected. In order to correct this error, the logic designer wishes to disconnect net 67 and create a new net that connects contact 65 on device 50 to a contact on device 54.

In a typical fabrication process, this would require one or more of the metal routing layer masks and the via masks to be re-fabricated. However with one embodiment to the present invention, this design change can be accomplished with a simple change to the mask used to form the vias between the first and second metal routing layers, with no change needed to the routing layer masks.

FIG. 4 illustrates a routing pattern 10C for the integrated circuit following the change to the via mask that is used to create the vias between the first and second metal routing layers. The same reference numerals are used in FIG. 4 as were used in FIGS. 2 and 3 for the same or similar elements. In the new via mask, via 72 (shown in FIGS. 2 and 3) is removed to de-couple signal segment S1 from signal segment S5 and therefore de-couple contact 65 from contact 66. Also, vias 82, 83 and 84 are removed to de-couple filler segments F2 and F4 from power supply straps 56 and 58 so that filler segment F4 can be used to form part of new net 110 connecting device 50 to device 54.

New vias 101 and 102 are added to couple signal segment S1 to filler segment F4 and to couple filler segment F4 to pin 104 of device 54. New net 110 has therefore been created between contact 65 and contact 66, which includes signal segments S1 and S4, filler segment F4 and vias 70, 71, 101 and 102.

In a similar manner, contact 66 of device 52 can be coupled to another device or net by adding a via 112 to couple signal segment S5 to filler segment F2. Filler segment F2 can then be coupled to one or more additional filler segments or signal segments on one or more routing layers to complete the new net.

The filler segments can be intentionally "segmented" or "partitioned" along the available routing paths to facilitate their re-use as signal segments. For example, filler segments F3 and F5 are segments that are routed along the same available routing path and are partitioned into two individual segments rather than a single wire segment. If desired, this partitioning can be optimized to maximize their re-use by taking into account routing information from other routing layers. In one embodiment, a partitioned wire is a wire than is divided into two or more individual segments along an available unused routing path. However, partitioning the filler segments is not required.

FIG. 5 is a flowchart illustrating an integrated circuit fabrication process according to one embodiment of the present invention. Semiconductor integrated circuits are designed and fabricated by first selecting or defining the cell library, at step 150. The cell library is typically defined by the manufacturer of the integrated circuit.

Next, the logic designer prepares a schematic diagram or hardware description language (HDL) specification of a logical circuit, at step 151, in which instances of the cells in the cell library are selected and interconnected to form a desired logical function. The schematic diagram or HDL specification is then passed to a computer-aided design verification tool, which assists the logic designer in verifying the desired logical function, at step 152. The design verification performed at step 152 often leads to changes in the schematic diagram or HDL specification prepared at step 151.

Once the schematic diagram or HDL specification is complete, it is passed to a series of additional computer-aided design tools, beginning at step 153, which assist the logic designer in converting the schematic diagram or HDL specification to a semiconductor integrated circuit layout definition that can be fabricated. At step 153, the schematic diagram or HDL specification is synthesized into the cells of the cell library defined in step 150. At step 154, the design tools generate a netlist of the selected cells and the interconnections between the cells. At step 155, the cell instances are "placed" to form a layout pattern for the integrated circuit by arranging the cells in selected locations. The cell instances may be placed manually or by an automatic placement tool.

At step 156, the electrical interconnections between the placed cell instances are routed along routing paths within the metal routing layers. Once all the electrical interconnections have been routed, including all signal, power, ground and clock connections, unused areas between these interconnections are filled with "dummy" filler segments or "wires", at step 158. These filler segments are then coupled to nearby power and ground segments to improve the distribution of the power and ground conductors throughout the layout pattern.

At step 159, the resulting netlist, layout pattern and corresponding cell definitions are released to fabrication. In fabrication, the base layer masks are cut at step 160. The base layer masks include the photolithography masks that are used for fabricating the semiconductor features on the lowest layers of the wafer, such as the source and drain diffusion regions, the gate oxide areas and the polysilicon electrode patterns. Higher level masks include the photolithography masks that are used for patterning metal routing layers and the electrical contacts or vias between the layers.

Once the base layer masks have been developed in step 160, the base layers can then be fabricated on the wafer at step 161. At step 162, the routing data is released to fabrication for use in cutting the metal layer photolithography masks and the via masks. At step 163, the contact layer, the metal layers and the vias between layers are fabricated on the wafer. The wafer is then divided into individual integrated circuit "chips", which are packaged and shipped at step 164.

During a typical design process, as a result of further design verification either after the metal layer masks have been cut at step 162 or test chips have been packaged and shipped at step 164, a design change is required. These changes often require new metal layer masks. In the embodiment shown in FIG. 5, if a design change is required at step 165, the logic designer determines, at step 166, whether the change can be implemented with one or more of the filler segments that were added at step 158.

If not, new metal layer masks are needed and the process returns to step 157 for re-routing the metal layers. If so, the via mask layout patterns are modified at step 168 and released for fabrication of new masks at step 169, which can be used during fabrication at step 163. The metal routing layer masks would not necessarily need to be re-fabricated.

FIG. 6 is a flowchart illustrating a process for fabricating an integrated circuit according to an alternative embodiment of the present invention. The same reference numerals are used in FIG. 6 as were used in FIG. 5 the same or similar steps. The flowchart shown in FIG. 6 allows new cells to be added to the netlist without requiring new base layer masks, as described in more detail in U.S. Pat. No. 6,093,214.

Although one or more of the routing layer masks would need to be re-cut, not all of the routing layer masks would not need to be re-cut. The unused filler segments described in the previous figures can be used to assist in connecting the new cells to the surrounding circuitry.

Referring to FIG. 6, once all of the cell instances from the netlist have been placed, functionally uncommitted base cells are placed in open areas in the layout pattern in and around the previously placed cell instances, at step 170. The base cell instances may be placed manually or through an automatic placement tool. In one embodiment, the manual or automatic placement process locates open areas or gaps in the layout pattern that are large enough to accommodate placement of a base cell instance. The base cell instances are then placed in the gaps. Each base cell instances includes one or more unconnected transistors which are sized and arranged to conform to any specified design rules for the cell library.

Subsequent design changes to the layout pattern that involve the insertion of additional transistor devices can be implemented by "metalizing" the transistors in one or more of the base cell instances in later processing steps.

If there are no more design changes after the metal layers have been routed, at step 171, the routing data is released to fabrication for use in cutting the metal layer photolithography masks and via masks at step 162. If there are further design changes that require the insertion of additional transistors devices, the process moves to step 172 to determine whether the base layer masks have or have not yet been release to fabrication. If not, then these changes can be made with another iteration through steps 150–155.

If the base layer masks have been released to fabrication, then any design change involving the insertion of additional semiconductor cells into the schematic diagram or HDL specification would normally require scraping the base layer mask set and any wafers fabricated in steps 161 and 163. However, the presence of the placed, functionally uncommitted base cell instances allows insertion of addition cells into the design, at step 173, from a "backfill" cell library without requiring the base layer mask set to be re-cut. The backfill cell library includes one or more functionally committed backfill cells that are geometrically compatible with one or more of the previously placed functionally uncommitted base cells instances.

When the design changes to the schematic diagram or HDL specification have been completed the previously existing cells are synthesized into cells from the standard cell library and the additional cells are synthesized into backfill cells from the backfill cell library, at the step 153. An updated netlist is generated at step 154. Since the placement of the cell instances has not changed, the cell instances do not need to be re-placed at step 155. Rather, the additional backfill cell instances are merged into the base cell sites in the layout pattern, at step 174. Once all the backfill cell instances have been merged into the layout pattern, the interconnections between the original cell instances and the backfill cell instances can be routed as necessary at step 157. In most cases, this may require a new metal layer mask.

However with the existence of the filler conductive segments, all metal layers may not require re-routing. The backfill cell instances can be metalized through the first metal routing layer, and subsequent connections can be made by simply changing one or more of the via masks to make use of the filler segments in connecting the backfill cell instances to the surrounding logic. In certain cases, more than one metal routing layer may need to be re-routed.

Although the present invention has been described with reference to preferred embodiments, workers skilled in the art will recognize that changes may be made in form and detail without departing from the spirit and scope of the invention. For example, unused filler segments can be used in a variety of additional ways to make subsequent design changes in addition to the specific examples shown in the figures and discussed above. In addition, the integrated circuit can include any number of routing layers, and the filler segments can be applied in any one or more of the layers. The terms "coupled" and "connected" can include a direct connection or a connection through one or more intermediate components. The term "power supply segment" can include a power segment and/or a ground segment. Also, the unused filler segments can be used in a variety of other semiconductor technologies, in addition to CMOS. In addition, the terms "first", "second", etc. as used in the specification and claims for identifying layers on an integrated circuit do not refer to any physical order of the layers or relative position. These layers can correspond to various layers on the integrated circuit, which can be adjacent to one another or non-adjacent.

What is claimed is:

1. A method of fabricating photolithography masks for an integrated circuit, the method comprising:

(a) fabricating a set of routing layer masks, which define conductive segments including signal segments, power supply segments and filler segments on various routing layers of the integrated circuit, wherein the filler segments are located in areas unused by the signal segments and the power supply segments;

(b) fabricating a first via mask, which defines electrical connections between the conductive segments on at least two of the routing layers, including connections between the filler segments on one of the layers and the power supply segments on another of the layers;

(c) changing a signal net on the integrated circuit after fabricating at least one of the routing layer masks and the first via mask; and (d) fabricating a second via mask to replace the first via mask, which decouples a first of the filler segments from a first of the power supply segments and couples the first filler segment into the signal net.

2. The method of claim 1 wherein the signal net is changed in step (c) through step (d) without changing any of the routing layer masks fabricated in step (a).

3. The method of claim 1 wherein the signal net comprises a first signal segment defined on the routing layer on which the first power supply segment is defined and wherein:

step (b) comprises fabricating the first via mask, which defines a first conductive via between the first filler segment and the first power supply segment; and step (d) comprises fabricating the second via mask to remove the first via and define a second via, which couples the first filler segment to the first signal segment of the signal net.

4. The method of claim 1 wherein:

in step (a), the first power supply segment and a first signal segment are defined by a first of the routing layer masks and the first filler segment and a second signal segment are defined by a second of the routing layer masks;

in step (b), the first via mask defines a first conductive via between the first filler segment and the first power supply segment and a second conductive via between the first and second signal segments, wherein the first and second signal segments and the second via at least partly define the signal net; and in step (d), the second via mask eliminates the first and second vias and defines a third via, which couples the first filler segment to the first signal segment to define a modified signal net.

5. The method of claim 1 wherein:

step (a) further comprises fabricating a base layer mask set, which defines a first contact of a semiconductor device within the integrated circuit; and step (d) further comprises fabricating the second via mask to define a conductive via between the first filler segment and the first contact.

6. A method of fabricating an integrated circuit having a logical function, the method comprising:

(a) fabricating first and second routing layer masks and a first via mask, wherein the first routing layer mask comprises power supply segments and signal segments, the second routing layer mask comprises signal segments and filler segments, wherein the filler segments are located in unused areas of the second routing layer mask, and the first via mask defines vias that electrically couple the filler segments to the power supply segments;

(b) changing the logical function after step (a);

(c) fabricating a second via mask, which decouples a first of the filler segments from the power supply segments and couples the first filler segment to a first of the signal segments defined by the first routing layer mask to implement the logical function change in step (b); and (d) fabricating the integrated circuit with the first and second routing layer masks and the second via mask.

7. The method of claim 6 wherein step (d) comprises fabricating the integrated circuit without any changes to the first and second routing layer masks after step (a).

8. The method of claim 6 wherein:

the first via mask defines a first conductive via between the first filler segment and a first of the power supply segments; and the second via mask removes the first via and defines a second via, which couples the first filler segment to the first signal segment.

9. The method of claim 8 wherein:

the second routing layer mask defines a second signal segment;

the first via mask defines a third conductive via between the first and second signal segments; and the second via mask removes the first and third vias.

10. The method of claim 6 wherein:

step (a) further comprises fabricating a base layer mask set, which defines a first contact of a semiconductor device within the integrated circuit; and step (c) further comprises fabricating the second via mask define a conductive via between the first filler segment and the first contact.

11. A collection of masks for fabricating a portion of an integrated circuit, the collection of masks comprising:

a first routing layer mask defining conductive segments, including a plurality of signal segments and at least one power supply segment;

a second routing layer mask defining conductive segments, including a plurality of signal segments and at least one filler segment located in an area unused by the signal segments;

a first via mask, which defines locations of conductive vias between the conductive segments defined by the first and second routing layer masks, including a first via that couples the filler segment to the power supply segment; and a second via mask which replaces the first via mask, wherein the second via mask eliminates the first via and adds a second via that couples the filler segment to one of the signal segments defined by the first routing layer mask instead of the power supply segment.

12. The collection of masks of claim 11 wherein:

the first routing layer mask defines a first signal segment;

the second routing layer mask defines a second signal segment;

the first via mask defines a third conductive via between the first and second signal segments; and the second via mask eliminates the first and third vias and adds the second via, which couples the filler segment to the first signal segment.

13. The collection of masks of claim 11 and further comprising:

a base layer mask set, which defines a first contact of a semiconductor device within the integrated circuit; and the second via mask defines a third conductive via, which couples the first filler segment and the first contact.

* * * * *